United States Patent
Cho et al.

(10) Patent No.: US 11,302,740 B2
(45) Date of Patent: Apr. 12, 2022

(54) OPTO-ELECTRONIC DEVICE HAVING JUNCTION FIELD-EFFECT TRANSISTOR STRUCTURE AND IMAGE SENSOR INCLUDING THE OPTO-ELECTRONIC DEVICE

(71) Applicant: SAMSUNG ELECTRONICS CO., LTD., Suwon-si (KR)

(72) Inventors: Kyungsang Cho, Gwacheon-si (KR); Chanwook Baik, Yongin-si (KR); Hojung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/930,574

(22) Filed: Jul. 16, 2020

(65) Prior Publication Data
US 2021/0249465 A1     Aug. 12, 2021

(30) Foreign Application Priority Data
Feb. 6, 2020   (KR) .......................... 10-2020-0014353

(51) Int. Cl.
*H01L 31/0352*      (2006.01)
*H01L 31/0384*      (2006.01)
(Continued)

(52) U.S. Cl.
CPC .. *H01L 27/14679* (2013.01); *H01L 31/03845* (2013.01); *H01L 31/035218* (2013.01); *H01L 31/1129* (2013.01)

(58) Field of Classification Search
CPC ......... H01L 27/14679; H01L 31/03845; H01L 31/1129; H01L 31/035218
(Continued)

(56) References Cited

U.S. PATENT DOCUMENTS 9,812,596 B2 *  11/2017  Cho ..................... H01L 31/032
9,905,790 B2     2/2018  Koh et al.
(Continued)

FOREIGN PATENT DOCUMENTS

| JP | 2009-38167 A | 2/2009 |
| KR | 10-2017-0048965 A | 5/2017 |
| KR | 10-2019-0072967 A | 6/2019 |

OTHER PUBLICATIONS

Cho, Kyung-Sang et al., "Color-selective photodetection from intermediate colloidal quantum dots buried in amorphous-oxide semiconductors", Nature Communications, 2007. (9 pages total).
(Continued)

*Primary Examiner* — David Vu
*Assistant Examiner* — Brandon C Fox
(74) *Attorney, Agent, or Firm* — Sughrue Mion, PLLC

(57) ABSTRACT

Provided is an opto-electronic device having low dark noise and a high signal-to-noise ratio. The opto-electronic device may include: a first semiconductor layer doped to have a first conductivity type; a second semiconductor layer disposed on an upper surface of the first semiconductor layer and doped to have a second conductivity type electrically opposite to the first conductivity type; a transparent matrix layer disposed on an upper surface of the second semiconductor layer; a plurality of quantum dots arranged to be in contact with the transparent matrix layer; and a first electrode provided on a first side of the transparent matrix layer and a second electrode provided on a second side of the transparent matrix layer opposite to the first side, wherein the first electrode and the second electrode are electrically connected to the second semiconductor layer.

23 Claims, 23 Drawing Sheets

(51) Int. Cl.
*H01L 31/112* (2006.01)
*H01L 27/146* (2006.01)

(58) Field of Classification Search
USPC .......................................................... 257/258
See application file for complete search history.

(56) References Cited

U.S. PATENT DOCUMENTS

| | | | |
|---|---|---|---|
| 10,529,879 B2 | 1/2020 | Cho et al. | |
| 2007/0215858 A1 | 9/2007 | Uchiyama et al. | |
| 2010/0308328 A1 | 12/2010 | Makihara et al. | |
| 2011/0278541 A1* | 11/2011 | Huang | H01L 31/07 257/21 |
| 2012/0280208 A1* | 11/2012 | Jain | B82Y 10/00 257/20 |
| 2013/0032782 A1 | 2/2013 | Gerasimos et al. | |
| 2015/0364545 A1* | 12/2015 | Heo | H01L 29/267 257/24 |
| 2016/0020352 A1* | 1/2016 | Konstantatos | H01L 31/18 257/24 |
| 2016/0366354 A1* | 12/2016 | Konstantatos | H01L 27/14632 |
| 2018/0337295 A1 | 11/2018 | Kallioinen et al. | |
| 2019/0189815 A1* | 6/2019 | Cho | H01L 31/1129 |

OTHER PUBLICATIONS

Konstantatos, Gerasimos et al., "Nanostructured materials for photon detection", Nature Nanotechnology, Jun. 2010, vol. 5, pp. 391-400. (10 pages total).
Adinolfi, Valerio et al., "Photovoltage field-effect transistors", Nature, Feb. 16, 2017, vol. 542, No. 7641, doi:10.1038/nature21050, pp. 324-327. (6 pages total).
"Supplementary Information", Nature, Feb. 16, 2017, vol. 542, No. 7641, doi:10.1038/nature21050, pp. 1-18. (18 pages total).
Communication dated Jan. 22, 2021 by the European Patent Office in counterpart European Patent Application No. 20185180.5.

* cited by examiner

OPTO-ELECTRONIC DEVICE HAVING JUNCTION FIELD-EFFECT TRANSISTOR STRUCTURE AND IMAGE SENSOR INCLUDING THE OPTO-ELECTRONIC DEVICE

CROSS-REFERENCE TO RELATED APPLICATION

This application is based on and claims priority from Korean Patent Application No. 10-2020-0014353, filed on Feb. 6, 2020, in the Korean Intellectual Property Office, the disclosure of which is incorporated herein in its entirety by reference.

BACKGROUND

1. Field

The disclosure relates to opto-electronic devices and image sensors including the opto-electronic devices, and more particularly, to quantum-dot opto-electronic devices having a junction field-effect transistor structure, and image sensors including the opto-electronic devices.

2. Description of Related Art

Recently, along with the increase in resolution of image sensors, pixel size of the image sensors has gradually decreased. For example, the pixel size of high-resolution image sensors used in cellular phones has reduced in size to less than about 1 µm. Such a small pixel size results in a decrease in the light-receiving area of light-receiving elements which are used to sense light, and thus, the number of photons entering each pixel per unit time decreases. Therefore, the proportion of dark noise in signals output by light-receiving elements of pixels relatively increases, and thus the signal-to-noise ratio is reduced, thereby making it difficult to obtain clear images. Accordingly, research into light-receiving devices has been conducted to reduce dark noise and improve light-receiving efficiency.

SUMMARY

Provided are opto-electronic devices having low dark noise and high signal-to-noise ratios.

Provided are image sensors including the opto-electronic devices.

Additional aspects will be set forth in part in the description which follows and, in part, will be apparent from the description, or may be learned by practice of the presented embodiments of the disclosure.

According to an aspect of the disclosure, there is provided an opto-electronic device comprising: a first semiconductor layer of a first conductivity type; a second semiconductor layer of a second conductivity type provided on an upper surface of the first semiconductor layer, the second conductivity type being electrically opposite to the first conductivity type; a transparent matrix layer provided on an upper surface of the second semiconductor layer; a plurality of quantum dots arranged to be in contact with the transparent matrix layer; and a first electrode provided on a first side of the transparent matrix layer and a second electrode provided on a second side of the transparent matrix layer opposite to the first side, wherein the first electrode and the second electrode are electrically connected to the second semiconductor layer.

The first semiconductor layer may be doped to have a first doping concentration, and the second semiconductor layer may be doped to have a second doping concentration less than the first doping concentration.

The plurality of quantum dots may be arranged on a two-dimensional plane in a single layer.

The plurality of quantum dots may be arranged on the upper surface of the second semiconductor layer to be in contact with the upper surface of the second semiconductor layer, and the transparent matrix layer may cover the plurality of quantum dots.

The plurality of quantum dots may be embedded in the transparent matrix layer without being in contact with the upper surface of the second semiconductor layer.

Entire peripheral surface of each of the plurality of quantum dots may be surrounded by the transparent matrix layer.

The plurality of quantum dots may be arranged on an upper surface of the transparent matrix layer to be in contact with the upper surface of the transparent matrix layer.

A ratio of a first area occupied by the plurality of quantum dots to a second area of the two-dimensional plane in the single layer in which the plurality of quantum dots are arranged may be about 0.1 or more.

The plurality of quantum dots may be arranged in a plurality of two-dimensional layers to have a stacked structure.

A gap may be provided between adjacent two-dimensional layers of the plurality of quantum dots, and the gap may be filled with the transparent matrix layer.

The plurality of quantum dots may be irregularly dispersed in the transparent matrix layer.

The transparent matrix layer may have a thickness of about 1 nm to about 100 nm.

The transparent matrix layer may comprise a transparent oxide semiconductor material.

The transparent semiconductor material may comprise at least one of silicon indium zinc oxide (SIZO), silicon zinc tin oxide (SZTO), indium gallium zinc oxide (IGZO), indium zinc oxide (IZO), or zinc tin oxide (ZTO).

The transparent matrix layer may have electrical characteristics of the first conductivity type.

The plurality of quantum dots may have electrical characteristics of the second conductivity type.

The transparent matrix layer may have electrical characteristics of the second conductivity type.

The plurality of quantum dots may have electrical characteristics of the first conductivity type.

The transparent matrix layer may comprise: a first matrix layer provided on the upper surface of the second semiconductor layer; and a second matrix layer provided on an upper surface of the first matrix layer, wherein the first matrix layer and the second matrix layer may have electrically opposite conductivity types.

The plurality of quantum dots may be arranged on the upper surface of the first matrix layer, and the second matrix layer may cover the plurality of quantum dots.

The first matrix layer may have electrical characteristics of the first conductivity type, the second matrix layer may have electrical characteristics of the second conductivity type, and the plurality of quantum dots may have electrical characteristics of the second conductivity type.

According to another aspect of the disclosure, there is provided an image sensor comprising: an array of opto-electronic devices; and a driving circuit configured to output a signal from each of the opto-electronic devices, wherein each of the opto-electronic devices comprises: a first semiconductor layer of a first conductivity type; a second semiconductor layer of a second conductivity type provided on an upper surface of the first semiconductor layer, the second conductivity type being electrically opposite to the first conductivity type; a transparent matrix layer provided on an upper surface of the second semiconductor layer; a plurality of quantum dots arranged to be in contact with the transparent matrix layer; and a first electrode provided on a first side of the transparent matrix layer and a second electrode provided on a second side of the transparent matrix layer opposite to the first side, wherein the first electrode and the second electrode are electrically connected to the second semiconductor layer.

According to another aspect of the disclosure, there is provided a junction field effect transistor (JFET) comprising: a first semiconductor layer; a second semiconductor layer provided on an upper surface of the first semiconductor layer; a transparent matrix layer provided on an upper surface of the second semiconductor layer; a plurality of quantum dots in contact with the transparent matrix layer; and a first electrode provided on a first side of the transparent matrix layer and a second electrode provided on a second side of the transparent matrix.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
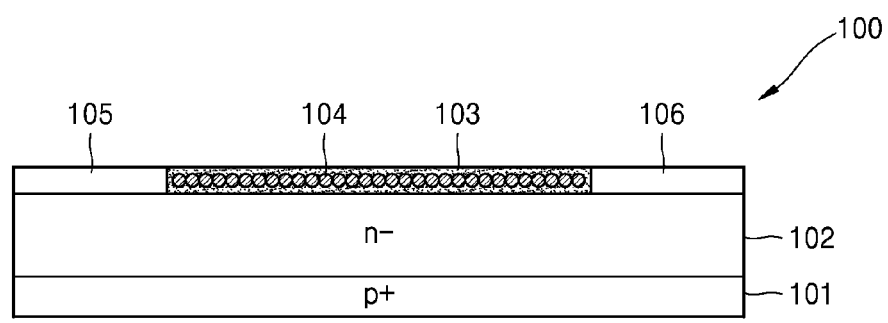
FIG. 1 is a cross-sectional view schematically illustrating a structure of an opto-electric device according to an example embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, opto-electronic devices having a junction field-effect transistor (JFET) structure and image sensors including the opto-electronic devices will be described with reference to the accompanying drawings. In the drawings, like reference numerals refer to like elements, and the sizes of elements may be exaggerated for clarity of illustration. In addition, embodiments described herein are for illustrative purposes only, and various modifications may be made therefrom.

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

In the disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or exemplary terms are just used herein to describe technical ideas and should not be considered for purposes of limitation unless defined by the claims.

FIG. 1 is a cross-sectional view schematically illustrating a structure of an opto-electronic device 100 according to an example embodiment. Referring to FIG. 1, the opto-electronic device 100 of the example embodiment may include a first semiconductor layer 101, a second semiconductor layer 102 disposed on an upper surface of the first semiconductor layer 101, a transparent matrix layer 103 disposed on an upper surface of the second semiconductor layer 102, a plurality of quantum dots 104 arranged in contact with the transparent matrix layer 103, and a first electrode 105 and a second electrode 106 that are respectively arranged on both sides of the transparent matrix layer 103.

The first semiconductor layer 101 may include a p+ semiconductor material which is heavily doped with a p type dopant. For example, the first semiconductor layer 101 may include silicon (Si), germanium (Ge), or a compound semiconductor material.

The second semiconductor layer 102 may include an n type semiconductor material doped with an n type dopant. For example, the second semiconductor layer 102 may include an n− semiconductor material lightly doped to a lower concentration than the doping concentration of the first semiconductor layer 101. The second semiconductor layer 102 may include the same type of semiconductor material as the first semiconductor layer 101 and may be doped to have a conductivity type that is electrically opposite to the conductivity type of the first semiconductor layer 101. Therefore, the first semiconductor layer 101 and the second semiconductor layer 102 form a pn junction.

The first electrode 105 and the second electrode 106 may be arranged on the upper surface of the second semiconductor layer 102 for electrical connection with the second semiconductor layer 102. The transparent matrix layer 103 may be disposed between the first electrode 105 and the second electrode 106. The first electrode 105 and the second electrode 106 may be directly in contact with the transparent matrix layer 103 disposed therebetween, or the first electrode 105 and the second electrode 106 may be apart from the transparent matrix layer 103 such that the first electrode 105 and the second electrode 106 may not be in contact with the transparent matrix layer 103. That is, the first electrode 105 and the second electrode 106 may be in physical contact with the transparent matrix layer 103, or the first electrode 105 and the second electrode 106 may not be in physical contact with the transparent matrix layer 103.

In this structure, the first semiconductor layer 101 functions as a gate, and the second semiconductor layer 102 functions as a channel. In addition, the first electrode 105 and the second electrode 106 function as a source electrode and a drain electrode. A separate gate insulating layer is not disposed between the first semiconductor layer 101 functioning as a gate and the second semiconductor layer 102 functioning as a channel. Therefore, the opto-electronic device 100 illustrated in FIG. 1 has a JFET structure.

When the first semiconductor layer 101 functioning as a gate is doped with a p type dopant and the second semiconductor layer 102 functioning as a channel is doped with an n type dopant, current flows between the first electrode 105 and the second electrode 106 through the second semiconductor layer 102 in a state in which a gate voltage is not applied to the first semiconductor layer 101. However, when a reverse voltage, that is, a negative voltage is applied to the first semiconductor layer 101, a depletion region of the second semiconductor layer 102 is widened, and thus current flowing between the first electrode 105 and the second electrode 106 decreases. In addition, when a reverse voltage equal to or higher than a specific level is applied to the first semiconductor layer 101, a depletion region is fully formed in the second semiconductor layer 102, and thus current does not flow between the first electrode 105 and the second electrode 106. According to an embodiment, the specific level is a predetermined level. Therefore, the opto-electronic device 100 is in an ON state when no voltage is applied to the first semiconductor layer 101 and in an OFF state when a reverse voltage equal to or greater than a threshold voltage is applied to the first semiconductor layer 101.

In addition, the transparent matrix layer 103 and the quantum dots 104 arranged on the second semiconductor layer 102 have a function of amplifying photocurrent generated by photons incident on the opto-electronic device 100. The quantum dots 104 are particles having a predetermined size and providing a quantum confinement effect. For example, the quantum dots 104 may include a compound such as CdSe, CdSe, CdTe, InP, InAs, InSb, PbSe, PbS, PbTe, AlAs, ZnS, ZnSe, or ZnTe. When light is incident on the quantum dots 104, the quantum dots 104 absorbs the light and generate photocarriers, that is, pairs of movable electrons and holes. As the photocarriers generated in the quantum dots 104 move through the transparent matrix layer 103 to the second semiconductor layer 102 functioning as a channel, photocurrent flows between the first electrode 105 and the second electrode 106. For example, when the second semiconductor layer 102 functioning as a channel is n-type, electrons may move as photocarriers to the second semiconductor layer 102.

The wavelength of light that the quantum dots 104 absorb may vary depending on the band gap of the quantum dots 104. The bandgap of the quantum dots 104 may be mainly determined by the diameter of the quantum dots 104. For example, the quantum dots 104 may have a diameter of about 1 nm to about 10 nm. Therefore, the diameter of the quantum dots 104 may be changed according to the wavelength of light to be detected by the opto-electronic device 100. When the opto-electronic device 100 is configured to detect light in a wide wavelength band, quantum dots 104 having various diameters may be provided. In addition, when the opto-electronic device 100 is configured to detect light in a specific wavelength band, quantum dots 104 having the same diameter is provided.

The transparent matrix layer 103 has a function of efficiently transferring photocarriers generated by the quantum dots 104 to the second semiconductor layer 102. In particular, the transparent matrix layer 103 efficiently separates electrons and holes generated in the quantum dots 104 and transfers the separated electrons or holes to the second semiconductor layer 102. To this end, the transparent matrix layer 103 is in contact with each of the quantum dots 104. In addition, the transparent matrix layer 103 includes a material transparent to light in a wavelength band to be detected by the opto-electronic device 100 such that incident light may be transmitted to the quantum dots 104. The transparent matrix layer 103 may include a transparent oxide semiconductor material. For example, the transparent matrix layer 103 may include a transparent oxide semiconductor material such as silicon indium zinc oxide (SIZO), silicon zinc tin oxide (SZTO), indium gallium zinc oxide (IGZO), indium zinc oxide (IZO), zinc tin oxide (ZTO), $CuAlO_2$, $CuG_2O_2$, $SrCu_2O_2$, or $SnO_2$.

The transparent matrix layer 103 may be formed to have a small thickness. For example, the thickness of the transparent matrix layer 103 may range from about 1 nm to about 100 nm. In another example, the thickness of the transparent matrix layer 103 may range from about 1 nm to about 50 nm. In another example, the thickness of the transparent matrix layer 103 may range from about 1 nm to about 30 nm. Since the transparent matrix layer 103 is formed to have a small thickness, the opto-electronic device 100 may have a sufficiently small thickness.

In the opto-electronic device 100 having the above-described JFET structure, voltage applied to the first semiconductor layer 101 may be adjusted to vary a size of the depletion region in the second semiconductor layer 102 and thus to control current flowing between the first electrode 105 and the second electrode 106 through the second semiconductor layer 102. Therefore, it is possible to suppress or reduce dark noise, which is caused by current flowing between the first electrode 105 and the second electrode 106 even when light is not incident on the opto-electronic device 100. Therefore, the signal-to-noise ratio of the opto-electronic device 100 may be improved.

In addition, the opto-electronic device 100 may be easily turned on/off by adjusting voltage applied to the first semiconductor layer 101, and thus only when a signal output is required, the opto-electronic device 100 may be turned on to perform a switching operation for outputting photocurrent from the opto-electronic device 100.

In addition, since the transparent matrix layer 103 and the quantum dots 104 arranged on the second semiconductor layer 102 function as a channel, more photocarriers are generated than photons incident on the opto-electronic device 100 per unit time, and thus the opto-electronic device 100 has a gain greater than 1. Therefore, the signal-to-noise ratio of the opto-electronic device 100 may be further improved because the transparent matrix layer 103 and the quantum dots 104 have an effect of amplifying an output signal. Therefore, clear images may be obtained using the opto-electronic device 100 of the embodiment even when incident light is weak.

In the example embodiment shown in FIG. 1, the first electrode 105 and the second electrode 106 protrude from the upper surface of the second semiconductor layer 102. According to an example embodiment, the upper surface of the second semiconductor layer 102 is flat, and a lower surface of the first electrode 105 and a lower surface of the second electrode 106 are on the same plane as the upper surface of the second semiconductor layer 102. However, the disclosure is not limited to the example illustrated in FIG. 1.

Figure 2:
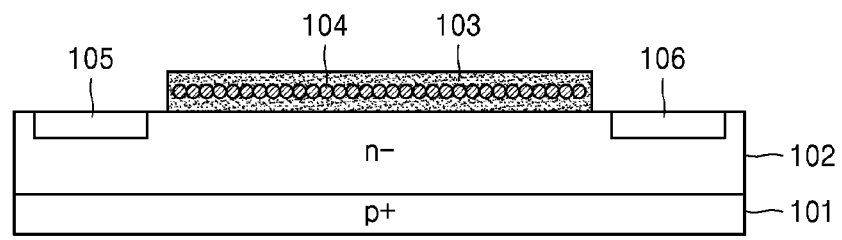
FIG. 2 is a cross-sectional view schematically illustrating a structure of an opto-electric device according to another example embodiment.

For example, FIG. 2 is a cross-sectional view schematically illustrating a structure of an opto-electronic device according to another example embodiment. Referring to FIG. 2, a first electrode 105 and a second electrode 106 may be arranged in an upper surface of a second semiconductor layer 102. According to an example embodiment, the first and second electrodes 105 and 106 may be embedded in the semiconductor layer 102, having only upper surfaces of the first and second electrodes 105 and 106 are exposed to the outside, and having lateral and lower surfaces of the first and second electrodes 105 and 106 surrounded by the second semiconductor layer 102. In this case, the upper surface of the first electrode 105 and the upper surface of the second electrode 106 may be on the same plane as the upper surface of the second semiconductor layer 102.

Figure 3:
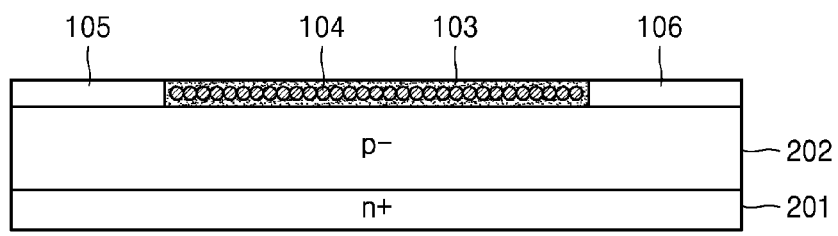
FIG. 3 is a cross-sectional view schematically illustrating a structure of an opto-electric device according to another example embodiment.

Furthermore, in the example embodiment shown in FIG. 1, the first semiconductor layer 101 is doped with a p type dopant, and the second semiconductor layer 102 is doped with an n type dopant. However, the disclosure is not limited to the example illustrated in FIG. 1. For example, FIG. 3 is a cross-sectional view schematically illustrating a structure of an opto-electronic device according to another example embodiment. Referring to FIG. 3, the opto-electronic device may include a first semiconductor layer 201 including an n+ semiconductor material doped to a high concentration, a second semiconductor layer 202 disposed on an upper surface of the first semiconductor layer 201 and including a p− semiconductor material doped to a low concentration, a transparent matrix layer 103 disposed on an upper surface of the second semiconductor layer 202, a plurality of quantum dots 104 arranged in contact with the transparent matrix layer 103, and a first electrode 105 and a second electrode 106 respectively arranged on both sides of the transparent matrix layer 103. When the second semiconductor layer 202 functioning as a channel is p− type, holes may move as photocarriers from the quantum dots 104 to the second semiconductor layer 202 in response to light incident on the quantum dots 104.

As shown in FIGS. 1 and 3, the first semiconductor layers 101 and 201 and the second semiconductor layers 102 and 202 may be doped to have electrically opposite conductivity types, thereby forming pn junctions. As in the example shown FIG. 1, the first semiconductor layer 101 may be p type and the second semiconductor layer 102 may be n type, or as in the example shown in FIG. 3, the first semiconductor layer 201 may be n type and the second semiconductor layer 202 may be p type. In addition, since the first semiconductor layers 101 and 201 functioning as gates may be doped to a relatively high concentration, and the second semiconductor layers 102 and 202 functioning as channels may be doped to a relatively low concentration. Here, in the embodiment shown in FIG. 1, the channel is n type such that charge carriers of the channel are electrons, and in the embodiment shown in FIG. 3, the channel is p type such that charge carriers of the channel are holes. Since the mobility of electrons is higher than the mobility of holes, the case in which a channel is n type may be relatively advantageous in view of the performance of an opto-electronic device.

In addition, the quantum dots 104 may be arranged in various manners. For example, FIGS. 4A to 4D are cross-sectional views illustrating various example arrangements of the quantum dots 104 in the transparent matrix layer 103.

Figure 4A:
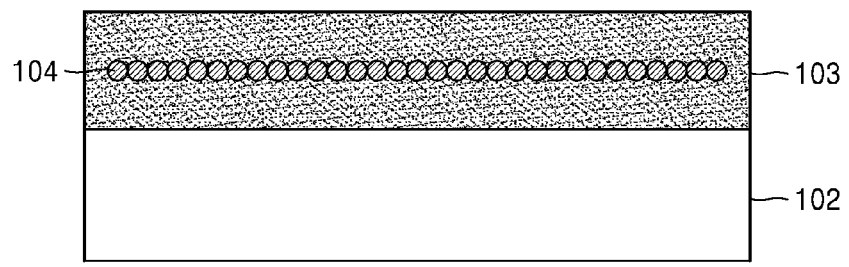
FIGS. 4A to 4D are cross-sectional views illustrating various example arrangements of a plurality of quantum dots in a transparent matrix layer.

Referring to FIG. 4A, the quantum dots 104 may be arranged on a two-dimensional plane in a single layer. A planar layer in which the quantum dots 104 are arranged may be parallel to the upper surface of the second semiconductor layer 102. In FIG. 4A, the quantum dots 104 are densely arranged in contact with each other. However, the disclosure is not limited to the example illustrated in FIG. 4A. In the planar layer in which the quantum dots 104 are arranged, the quantum dots 104 may be distributed apart from each other. However, when the number of quantum dots 104 is too small, it is difficult to obtain an amplification effect, and thus a sufficient number of quantum dots 104 may be arranged. For example, the ratio of the area occupied by the quantum dots 104 to the area of the two-dimensional plane in the planar layer in which the plurality of quantum dots are arranged may be about 0.1 or more Referring to FIG. 4B, the quantum dots 104 may be arranged in a plurality of two-dimensional layers to have a stacked structure. In this case, the number of quantum dots 104 may increase, and thus the amplification effect may be further improved. However, when the number of layers in which the quantum dots 104 are stacked is excessively large, incident light may not be transmitted to a lower side. Therefore, the number of layers in which the quantum dots 104 are arranged may be appropriately selected to obtain optimal efficiency. For example, the quantum dots 104 may be stacked up to 30 layers. Alternatively, the quantum dots 104 may be stacked up to 10 layers. In yet another example, the quantum dots 104 may be stacked in three or fewer layers.

Figure 4B:
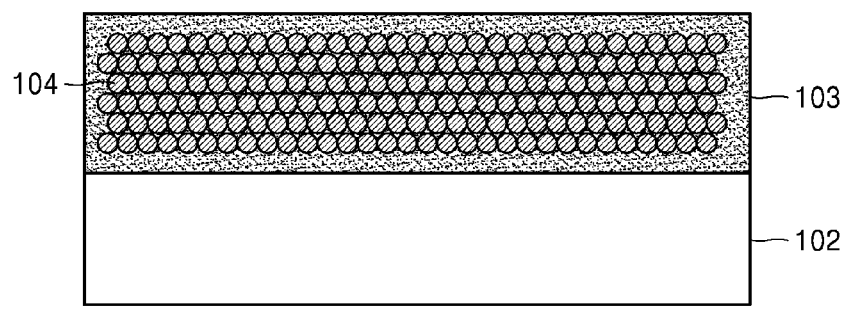
Figure 4C:
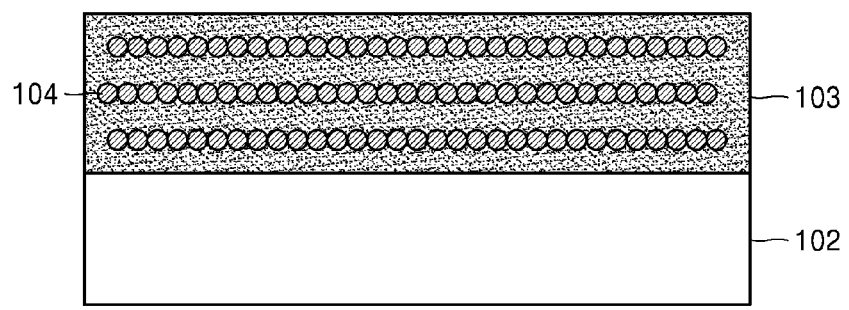

In FIG. 4B, the quantum dots 104 are stacked without gaps between layers in which the quantum dots 104 are arranged. However, the disclosure is not limited to the example illustrated in FIG. 4B. For example, as shown in FIG. 4C, there may be gaps between adjacent two-dimensional layers in which the quantum dots 104 are arranged. In this case, the gaps between the layers in which the quantum dots 104 are arranged may be filled with the transparent matrix layer 103. However, the disclosure is not limited to the example illustrated in FIG. 4C. For example, there may be gaps between only some of the adjacent two-dimensional layers in which the quantum dots 104 are arranged, and the other adjacent two-dimensional layers may be arranged without gaps between layers in which the quantum dots 104 are arranged.

Figure 4D:
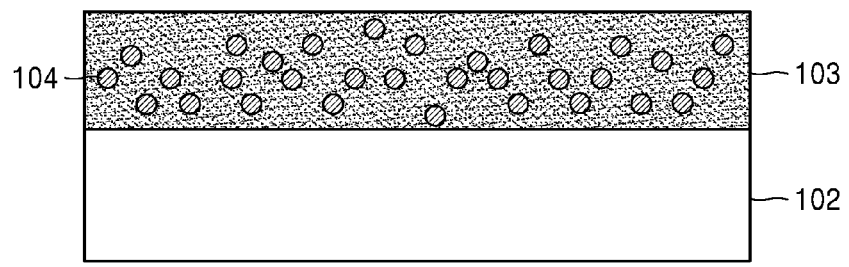

In addition, referring to FIG. 4D, the quantum dots 104 may be irregularly dispersed in the transparent matrix layer 103. Therefore, the spacing between the quantum dots 104 may not be constant. In this case, the transparent matrix layer 103 in which the quantum dots 104 are dispersed may be easily formed by mixing the quantum dots 104 in the material of the transparent matrix layer 103 and applying the material to the second semiconductor layer 102.

In the example shown in FIGS. 4A to 4D, the quantum dots 104 are embedded inside the transparent matrix layer 103. Therefore, the surface of each quantum dot 104 is completely surrounded by the transparent matrix layer 103. In addition, each of the quantum dots 104 is not in contact with the upper surface of the second semiconductor layer 102 and an upper surface of the transparent matrix layer 103. However, the disclosure is not limited to the example illustrated in FIGS. 4A to 4D. For example, FIGS. 5A and 5B are cross-sectional views illustrating different arrangements of the quantum dots 104 as examples.

Figure 5A:
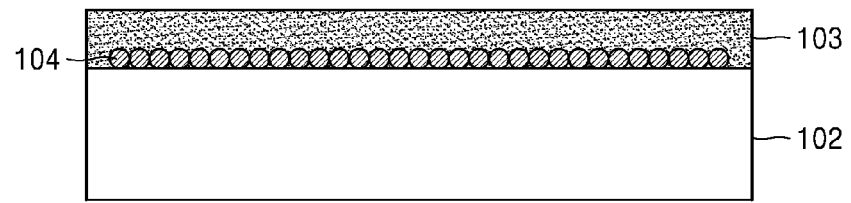
FIGS. 5A and 5B are cross-sectional views illustrating different example arrangements of a plurality of quantum dots as examples.

Referring to FIG. 5A, the quantum dots 104 may be arranged on the upper surface of the second semiconductor layer 102. In this case, a lower portion of each of the quantum dots 104 may be in contact with the upper surface of the second semiconductor layer 102. The transparent matrix layer 103 may be disposed on the second semiconductor layer 102 to cover the quantum dots 104. The transparent matrix layer 103 may be in contact with a lateral side and an upper portion of each of the quantum dots 104 except for the lower portion of each of the quantum dots 104 that is in contact with the second semiconductor layer 102.

Figure 5B:
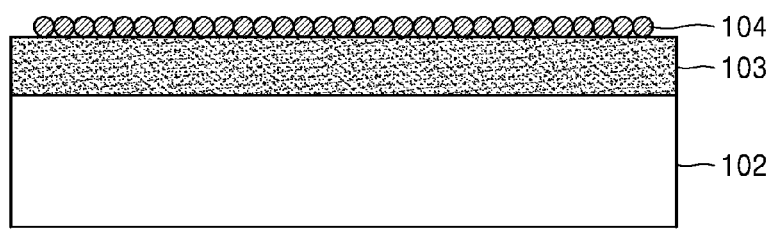

Referring to FIG. 5B, the quantum dots 104 may be arranged on the upper surface of the transparent matrix layer 103. In this case, only the lower portion of each of the quantum dots 104 may be in contact with the upper surface of the transparent matrix layer 103.

Figure 6:
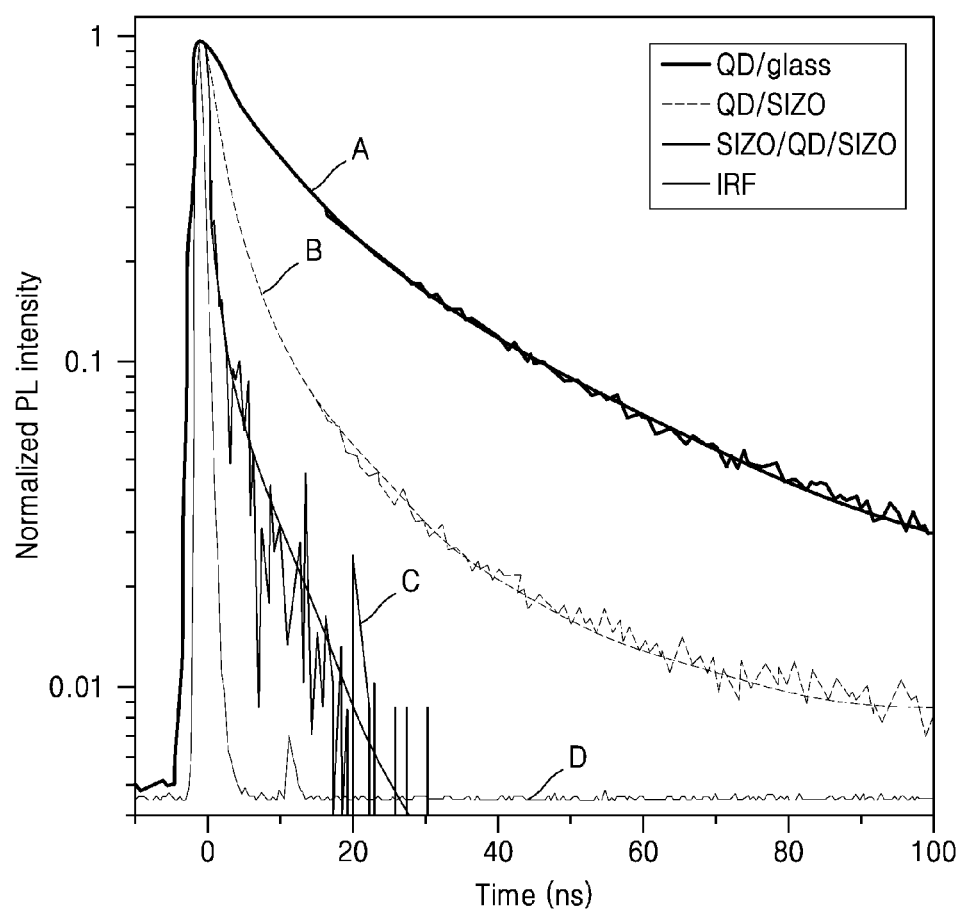
FIG. 6 is a graph illustrating charge separation characteristics according to various arrangements of a transparent matrix layer and quantum dots.

FIG. 6 is a graph illustrating charge separation characteristics according to various arrangements of the transparent matrix layer 103 and the quantum dots 104 for comparison of the charge separation characteristics. The graph shown in FIG. 6 is obtained by measuring the decay time of photoluminescence (PL) occurring in the quantum dots 104 when the quantum dots 104 are excited by laser pulses applied thereto. In FIG. 6, the curve indicated by "A" refers to a comparative example in which only quantum dots 104 are arranged on a glass substrate (that is, a QD/glass structure), the curve indicated by "B" refers to the case in which quantum dots 104 are arranged on a glass substrate and SIZO (silicon indium zinc oxide) is disposed as a transparent matrix layer 103 on the glass substrate to cover the quantum dots 104 (that is, a QD/SIZO structure), the curve indicated by "C" refers to the case in which SIZO is first disposed as a transparent matrix layer 103 on a glass substrate, quantum dots 104 are arranged on the SIZO, and then SIZO is disposed to cover the quantum dots 104 (that is, a SIZO/QD/SIZO structure), and the IRF (Infrared Fluorescence photography) curve indicated by "D" refers to laser pulses applied to the quantum dots 104.

Referring to the graph of FIG. 6, it may be understood that the lifetime of PL is shorter in the QD/SIZO structure than in the QD/glass structure, and the lifetime of PL is shorter in the SIZO/QD/SIZO structure than in the QD/SIZO structure. This means that electrons and holes generated in the quantum dots 104 are separated faster in the QD/SIZO structure than in the QD/glass structure, and also faster in the SIZO/QD/SIZO structure than in the QD/SIZO structure. In other words, the rate of charge separation is higher in the QD/SIZO structure than in the QD/glass structure, and the rate of charge separation is higher in the SIZO/QD/SIZO structure than in the QD/SIZO structure. The charge separation rate of the QD/SIZO structure calculated from the graph shown in FIG. 6 is about 0.5/ns, and the charge separation rate of the SIZO/QD/SIZO structure calculated from the graph shown in FIG. 6 is about 3.3/ns.

Therefore, it may be understood that as the area of the interface between the transparent matrix layer 103 and the quantum dots 104 increases, the rate of charge separation increases. Moreover, a high charge separation rate means a high charge separation efficiency. An opto-electronic device having a high charge separation efficiency may have high sensitivity. In such a case, the opto-electronic device may generate a high photocurrent even with a small amount of light, and thus the opto-electronic device may have an improved signal-to-noise ratio and a low driving voltage.

In FIGS. 1 and 3, only the doping characteristics of the first semiconductor layers 101 and 201 and the second semiconductor layers 102 and 202 are described. However, the transparent matrix layer 103 may also have n type or p type conductivity characteristics. For example, FIGS. 7A to 7D are cross-sectional views schematically illustrating various structures of opto-electronic devices according to other embodiments.

Figure 7A:
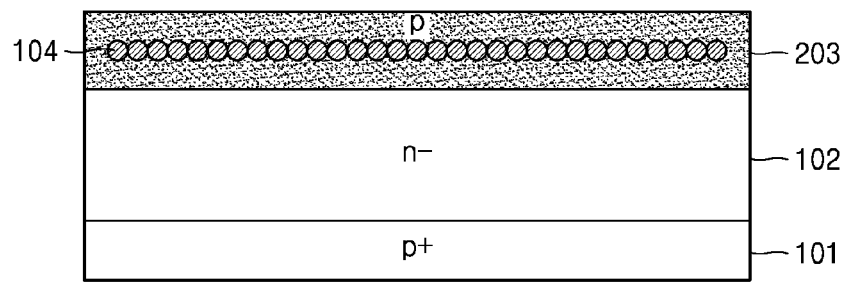
FIGS. 7A to 7D are cross-sectional views schematically illustrating various structures of opto-electronic devices according to other example embodiments.

Referring to FIG. 7A, an opto-electronic device may include a first semiconductor layer 101 doped with a p+ type dopant, a second semiconductor layer 102 doped with an n− type dopant, a transparent matrix layer 203 of a p type, and a plurality of quantum dots 104 arranged in contact with the transparent matrix layer 203. Although electrodes are not shown in FIG. 7A, electrodes are further arranged on both sides of the transparent matrix layer 203 as shown in FIGS. 1 to 3. In the structure shown in FIG. 7A, the first semiconductor layer 101 and the transparent matrix layer 203 have the same electrical conductivity type, and the doping concentration of the first semiconductor layer 101 is greater than the doping concentration of the transparent matrix layer 203.

Figure 7B:
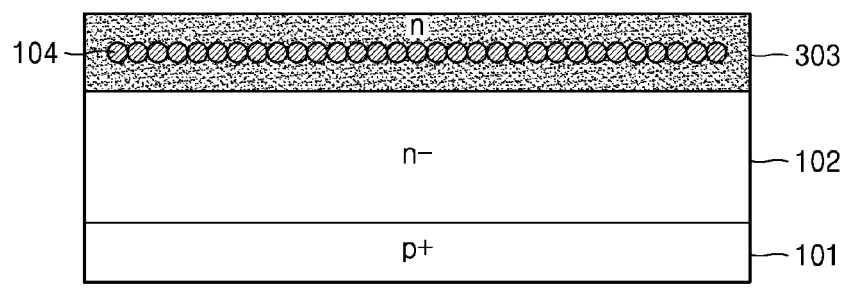

Referring to FIG. 7B, an opto-electronic device may include a first semiconductor layer 101 doped with a p+ type dopant, a second semiconductor layer 102 doped with an n− type dopant, a transparent matrix layer 303 of an n type, and a plurality of quantum dots 104 arranged in contact with the transparent matrix layer 303. In the structure shown in FIG. 7B, the second semiconductor layer 102 and the transparent matrix layer 303 have the same electrical conductivity type.

Figure 7C:
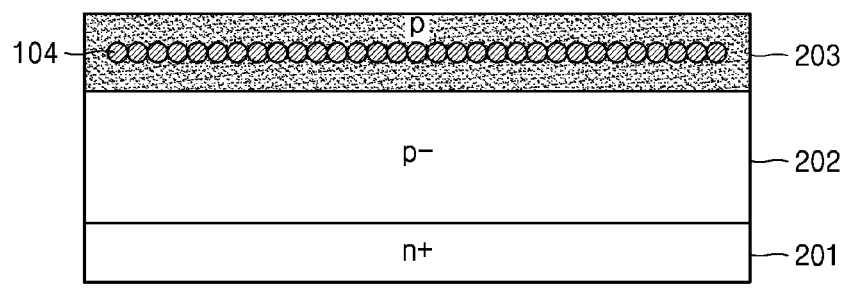

Referring to FIG. 7C, an opto-electronic device may include a first semiconductor layer 201 doped with an n+ type dopant, a second semiconductor layer 202 doped with a p− type dopant, a transparent matrix layer 203 of a p type, and a plurality of quantum dots 104 arranged in contact with the transparent matrix layer 203. In the structure shown in FIG. 7C, the second semiconductor layer 202 and the transparent matrix layer 203 have the same electrical conductivity type.

Figure 7D:
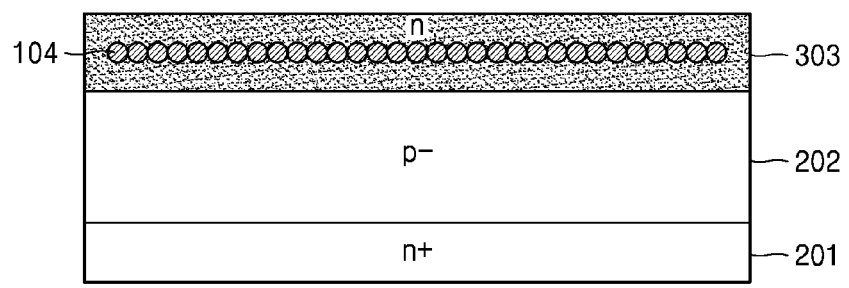

Referring to FIG. 7D, an opto-electronic device may include a first semiconductor layer 201 doped with an n+ type dopant, a second semiconductor layer 202 doped with a p− type dopant, a transparent matrix layer 303 of an n type, and a plurality of quantum dots 104 arranged in contact with the transparent matrix layer 303. In the structure shown in FIG. 7D, the first semiconductor layer 201 and the transparent matrix layer 303 have the same electrical conductivity type.

Each of the p type transparent matrix layer 203 and the n type transparent matrix layer 303 may be formed through a separate doping process. However, a transparent oxide semiconductor material inherently having p type or n type electrical characteristics without doping may be used as the p type transparent matrix layer 203 or the n type transparent matrix layer 303. In general, for example, zinc-containing oxides such as SIZO, SZTO, IGZO, IZO, and ZTO may be transparent oxide semiconductor materials having inherent n type electrical characteristics. In addition, for example, $CuAlO_2$, $CuG_2O_2$, $SrCu_2O_2$, $SnO_2$, and the like may be transparent oxide semiconductor materials having inherent p type electrical characteristics.

As shown in FIGS. 7A and 7D, when the first semiconductor layers 101 and 201 and the transparent matrix layers 203 and 303 have the same electrical conductivity type, the transparent matrix layers 203 and 303 may also may function as gates. Therefore, the opto-electronic devices shown in FIGS. 7A and 7D have a double gate JFET structure including two gates. Since gates are respectively arranged on the lower and upper portions of the second semiconductor layers 102 and 202 which are channel layers, depletion regions may be adjusted at the lower and upper portions of the channel layers, and thus dark noise may be more easily reduced or suppressed.

In addition, as shown in FIGS. 7B and 7C, when the second semiconductor layers 102 and 202 and the transparent matrix layers 203 and 303 have the same conductivity type, the opto-electronic devices each have only one gate. In this case, gates are provided only on lower portions of the second semiconductor layers 102 and 202 which are channel layers, and depletion regions may be controlled at the lower portions of the channel layers. Therefore, photocarriers may be transferred without loss from the transparent matrix layers 203 and 303 provided on upper portions of the second semiconductor layers 102 and 202 to the second semiconductor layers 102 and 202 which are channels. Then, the intensity of output signals of the opto-electronic devices may be increased.

In addition to the transparent matrix layers 203 and 303, the quantum dots 104 may also have n type or p type conductivity characteristics. For example, FIGS. 8A to 8D are cross-sectional views schematically illustrating various structures of opto-electronic devices according to other embodiments.

Figure 8A:
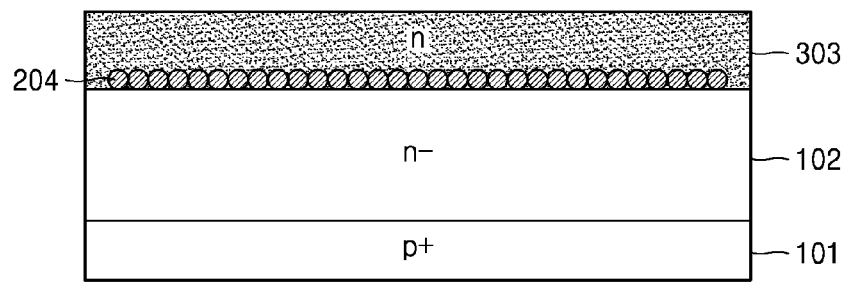
FIGS. 8A to 8D are cross-sectional views schematically illustrating various structures of opto-electronic devices according to other example embodiments.

Referring to FIG. 8A, an opto-electronic device may include a first semiconductor layer 101 doped with a p+ type dopant, a second semiconductor layer 102 doped with an n– type dopant, a transparent matrix layer 303 of an n type, and a plurality of quantum dots 204 of a p type. The quantum dots 204 are arranged on an upper surface of the second semiconductor layer 102. Although electrodes are not shown in FIG. 8A, electrodes are further arranged on both sides of the transparent matrix layer 303 as shown in FIGS. 1 to 3.

In the structure of the opto-electronic device shown in FIG. 8A, the second semiconductor layer 102 and the transparent matrix layer 303 have the same electrical conductivity type. Therefore, the opto-electronic device shown in FIG. 8A has one gate.

In addition, the quantum dots 204 have a conductivity type which is electrically opposite to the conductivity type of the second semiconductor layer 102 and the transparent matrix layer 303. Therefore, while light is not incident on the quantum dots 204, the quantum dots 204 may form a depletion region at the interface with the second semiconductor layer 102. Therefore, dark noise may be reduced. In addition, when the quantum dots 204 are excited by receiving light, the quantum dots 204 release photocarriers (for example, electrons). Therefore, when light is incident on the quantum dots 204, electrons released from the quantum dots 204 may be efficiently transferred to the n– type second semiconductor layer 102 through the n type transparent matrix layer 303.

Figure 8B:
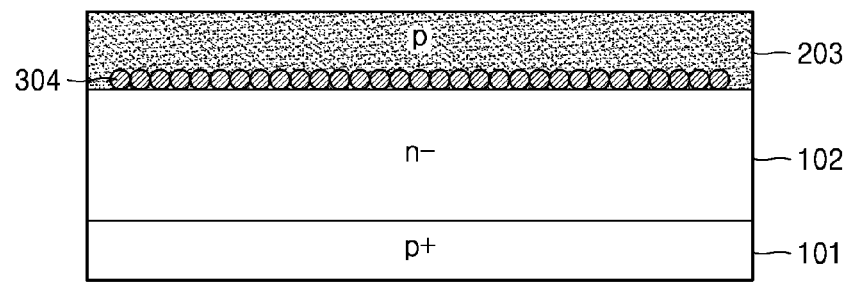

Referring to FIG. 8B, an opto-electronic device may include a first semiconductor layer 101 doped with a p+ type dopant, a second semiconductor layer 102 doped with an n– type dopant, a transparent matrix layer 203 of a p type, and a plurality of quantum dots 304 of an n type. The quantum dots 304 are arranged on an upper surface of the second semiconductor layer 102.

In the structure of the opto-electronic device shown in FIG. 8B, the first semiconductor layer 101 and the transparent matrix layer 203 have the same electrical conductivity type, and the second semiconductor layer 102 and the transparent matrix layer 203 have electrically opposite conductivity types. In addition, since the transparent matrix layer 203 fills interstices between the quantum dots 304 and makes contact with the second semiconductor layer 102 provided on a lower side thereof, the transparent matrix layer 203 may form a depletion region at the interface with the second semiconductor layer 102. Therefore, the opto-electronic device shown in FIG. 8B has a double gate JFET structure including two gates.

In addition, the quantum dots 304 have a conductivity type which is electrically opposite to the conductivity type of the transparent matrix layer 203 and is the same as the conductivity type of the second semiconductor layer 102. In addition, when the quantum dots 304 are excited by receiving light, the quantum dots 304 release photocarriers (for example, electrons). Therefore, when light is incident on the quantum dots 304, photocarriers released from the quantum dots 304 may be transferred to the second semiconductor layer 102 through the p type transparent matrix layer 203.

Each of the p type quantum dots 204 and the n type quantum dots 304 may be formed through a separate doping process. However, quantum dots inherently having p type or n type electrical characteristics without doping may be used as the p type quantum dots 204 or then type quantum dots 304. In general, for example, CdSe, CdSe, CdTe, InP, InAs, InSb, AlAs, ZnS, ZnSe, ZnTe, or the like is used to form quantum dots inherently having n type electrical characteristics. In addition, for example, PbSe, PbS, PbTe, or the like is used to form quantum dots inherently having p type electrical characteristics.

Figure 8C:
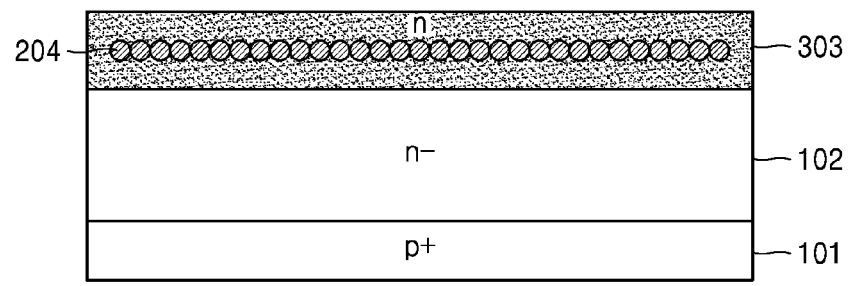
Figure 8D:
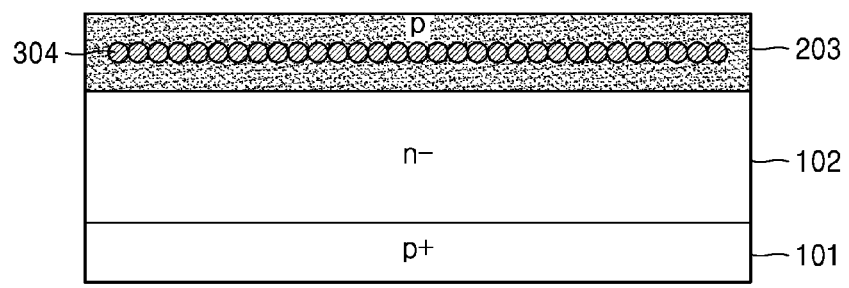

The opto-electronic device shown in FIG. 8C has substantially the same structure as the structure of the opto-electronic device shown in FIG. 8A except that a plurality of quantum dots 204 are not in contact with a lower second semiconductor layer 102. In addition, the opto-electronic device shown in FIG. 8D has substantially the same structure as the structure of the opto-electronic device shown in FIG. 8B except that a plurality of quantum dots 304 are not in contact with a lower second semiconductor layer 102. As shown in FIGS. 8C and 8D, even when the quantum dots 204 and 304 are not in contact with the second semiconductor layers 102, the opto-electronic devices may operate similarly to that described with reference to FIGS. 8A and 8B.

Figure 9:
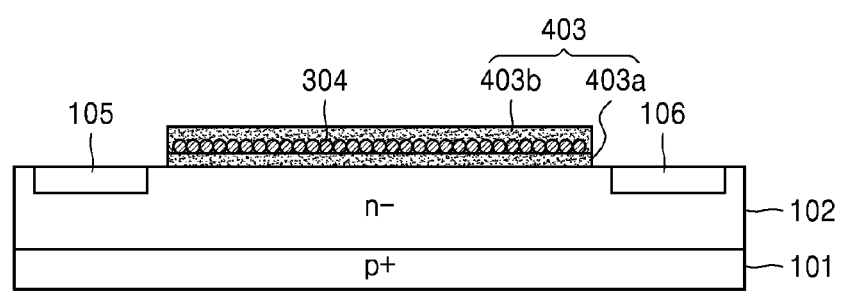
FIG. 9 is a cross-sectional view schematically illustrating a structure of an opto-electric device according to another example embodiment.

FIG. 9 is a cross-sectional view schematically illustrating a structure of an opto-electronic device according to another example embodiment. Referring to FIG. 9, the opto-electronic device may include a first semiconductor layer 101 doped with a p+ type dopant, a second semiconductor layer 102 doped with an n– type dopant, a transparent matrix layer 403 disposed on the second semiconductor layer 102, and a plurality of quantum dots 304 arranged inside the transparent matrix layer 403.

The transparent matrix layer 403 of the opto-electronic device may include a first matrix layer 403a disposed on an upper surface of the second semiconductor layer 102 and a second matrix layer 403b disposed on an upper surface of the first matrix layer 403a. The quantum dots 304 may be arranged between the first matrix layer 403a and the second matrix layer 403b. For example, after the first matrix layer 403a is formed, the quantum dots 304 may be arranged on the upper surface of the first matrix layer 403a, and the second matrix layer 403b may be formed on the first matrix layer 403a to cover the quantum dots 304.

In the embodiment, the first matrix layer 403a and the second matrix layer 403b may have electrically opposite conductivity types. For example, the first matrix layer 403a making direct contact with the second semiconductor layer 102 may be of a p type which is electrically opposite to the conductivity type of the second semiconductor layer 102, and the second matrix layer 403b and the second semiconductor layer 102 may be of the same n type. In addition, the quantum dots 304 may have a conductivity type which is electrically opposite to the conductivity type of the first matrix layer 403a. For example, the quantum dots 304 and the second matrix layer 403b may be of the same n type. In this case, the lower first matrix layer 403a provided at a relatively lower side may form a depletion region at the interface with the second semiconductor layer 102. The second matrix layer 403b provided at a relatively upper side may help photocarriers (for example, electrons) generated from the quantum dots 104 to efficiently move to the second semiconductor layer 102.

In addition to the structures shown in FIGS. 7A to 7D, 8A to 8D, and 9, various other structures and various other conductivity type combinations are possible for configuring a first semiconductor layer, a second semiconductor layer, a matrix layer, and quantum dots.

Figure 10A:
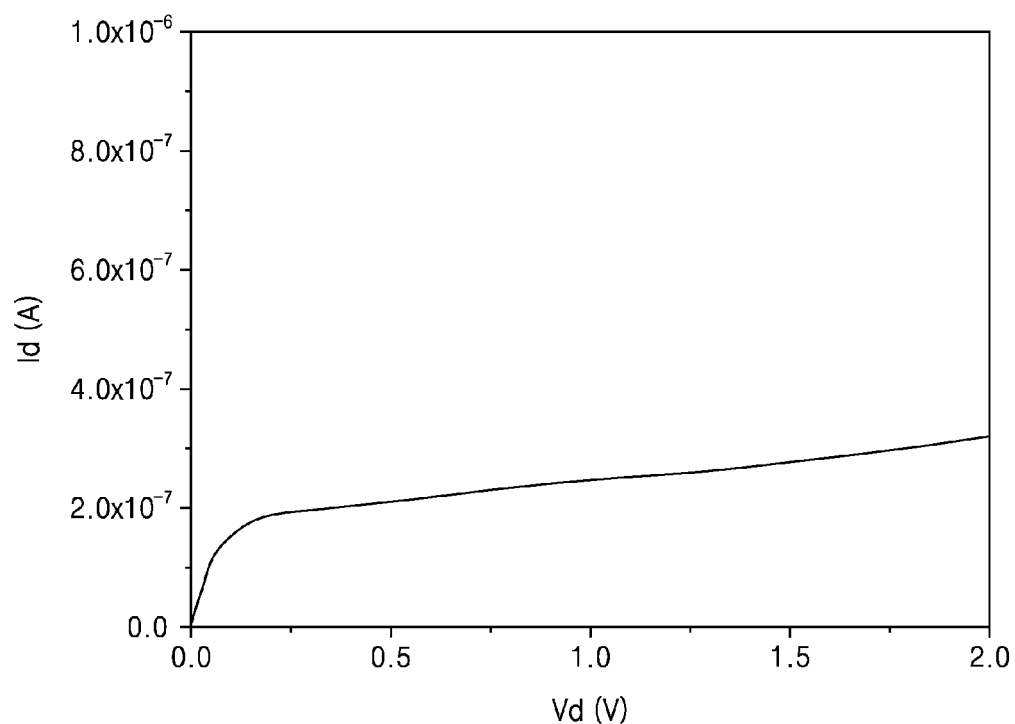
FIGS. 10A to 10C are graphs for comparing dark noises in a junction field-effect transistor (JFET) according to a comparative example and in JFETs according to example embodiments of the disclosure.
Figure 10B:
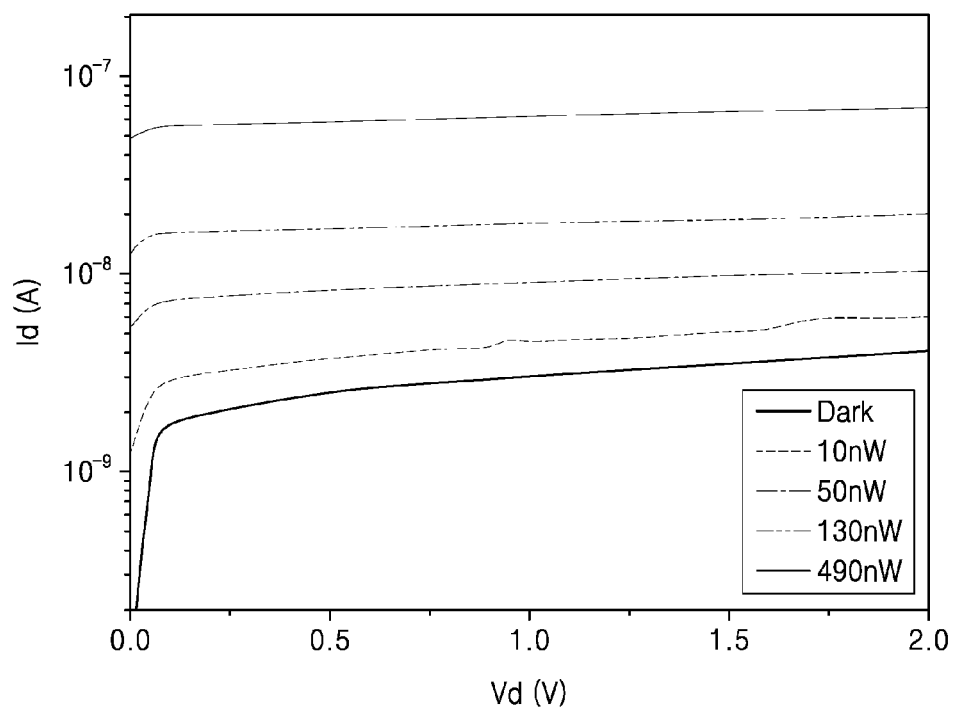
Figure 10C:
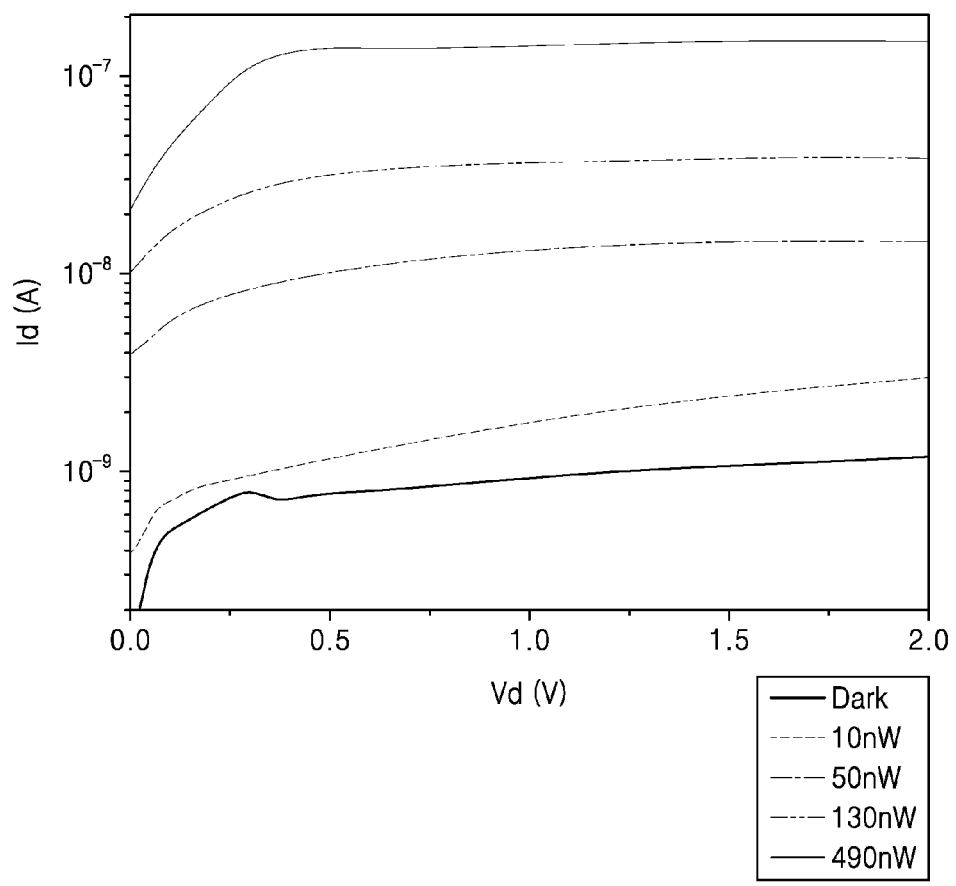

FIGS. 10A to 10C are graphs for comparing dark noises in a JFET according to a comparative example and in JFETs according to example embodiments of the disclosure. FIG. 10A is a graph illustrating dark noise of a JFET according to a comparative example. When light was not incident on the JEFT of the comparative example, current flowing between a first electrode and a second electrode was measured as shown in FIG. 10A. The JFET of the comparative example does not include quantum dots and a matrix layer but includes only a first semiconductor layer as a gate and a second semiconductor layer as a channel, and the thickness of the second semiconductor layer is about 0.55 μm.

In addition, FIG. 10B is a graph illustrating current measured between the first electrode 105 and the second electrode 106 while adjusting the intensity of light incident on the opto-electronic device of the embodiment shown in FIG. 5A in which the quantum dots 104 are arranged in contact with the upper surface of the second semiconductor layer 102. FIG. 10C is a graph illustrating current measure between the first electrode 105 and the second electrode 106 while adjusting the intensity of light incident on the opto-electronic device of the embodiment shown in FIG. 1 in which lower and upper portions of the quantum dots 104 are completely surrounded by the transparent matrix layer 103.

When the graphs shown in FIGS. 10A to 10C are compared with each other, it may be understood that the dark noise of the opto-electronic device of the embodiment shown in FIG. 5A is significantly less than the dark noise of the JFET of the comparative example. In addition, it may be understood that the dark noise of the opto-electronic device of the embodiment shown in FIG. 1 is less than the dark noise of the opto-electronic device of the embodiment shown in FIG. 5A. In addition, it may also be understood that the opto-electronic device of the embodiment shown FIG. 1 has higher sensitivity than the opto-electronic device of the embodiment shown in FIG. 5A.

As described above, the opto-electronic devices of the embodiments may have low dark noise and high signal-to-noise ratios. Therefore, since the opto-electronic devices have high sensitivity, the opto-electronic devices may be operated even with a low driving voltage, for example, about 10 V or less. Moreover, since the wavelength band of light that may be received is determined by the band gap of the quantum dots, silicon (Si) which is a common semiconductor material may be used to form the first and second semiconductor layers. Therefore, inexpensive optoelectronic devices may be manufactured through general silicon processes. The opto-electronic devices of the embodiments are operable in a wide wavelength band of about 400 nm to about 2,000 nm, for example.

Figure 11:
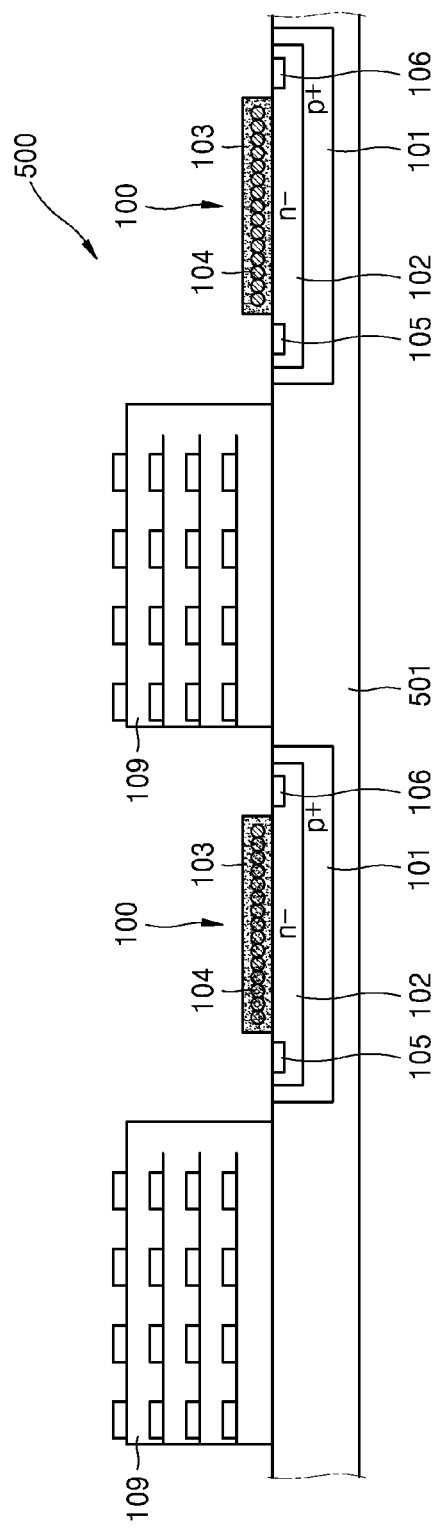
FIG. 11 is a cross-sectional view schematically illustrating a structure of an image sensor according to an example embodiment.

The opto-electronic devices may be individually used as light receiving devices, or may be arranged in a two-dimensional array to form an image sensor. For example, FIG. 11 is a cross-sectional view schematically illustrating a structure of an image sensor 500 including a plurality of opto-electronic devices 100 according to an embodiment. Referring to FIG. 11, the image sensor 500 includes an array of the opto-electronic devices 100 formed on a semiconductor substrate 501, and a plurality of driving circuits 109 for outputting signals from the opto-electronic devices 100. Although only two opto-electronic devices 100 and two driving circuits 109 are shown in FIG. 11 for ease of illustration, a large number of opto-electronic devices 100 and a large number of driving circuits 109 are actually arranged in the form of a two-dimensional array.

Since the opto-electronic devices 100 have low dark noise and high sensitivity, the image sensor 500 may obtain clear images even with weak incident light. In addition, since it is possible to further reduce the size of pixels of the image sensor 500, the resolution of the image sensor 500 may be further increased.

While opto-electronic devices having a JFET structure and image sensors including the opto-electronic devices have been described according to example embodiments with reference to the accompanying drawings, it will be understood by those of ordinary skill in the art that the opto-electronic devices and the image sensors are merely examples, and various modifications and other equivalent embodiments may be made therein. Therefore, example embodiments described herein should be considered in a descriptive sense only and not for purposes of limitation. The scope of the disclosure is defined not by the above description but by the following claims, and all differences within equivalent ranges of the scope of the disclosure should be considered as being included in the scope of the disclosure.

What is claimed is:

1. An opto-electronic device comprising:
   a first semiconductor layer of a first conductivity type;
   a second semiconductor layer of a second conductivity type provided on an upper surface of the first semiconductor layer, the second conductivity type being electrically opposite to the first conductivity type;
   a transparent matrix layer provided on an upper surface of the second semiconductor layer;

a plurality of quantum dots arranged to be in contact with the transparent matrix layer; and a first electrode provided on a first side of the transparent matrix layer and a second electrode provided on a second side of the transparent matrix layer opposite to the first side, wherein the first electrode and the second electrode are electrically connected to the second semiconductor layer, wherein the first semiconductor layer is doped to have a first doping concentration, and the second semiconductor layer is doped to have a second doping concentration less than the first doping concentration.

2. The opto-electronic device of claim 1, wherein the plurality of quantum dots are arranged on a two-dimensional plane in a single layer.

3. The opto-electronic device of claim 2, wherein the plurality of quantum dots are arranged on the upper surface of the second semiconductor layer to be in contact with the upper surface of the second semiconductor layer, and the transparent matrix layer covers the plurality of quantum dots.

4. The opto-electronic device of claim 2, wherein the plurality of quantum dots are embedded in the transparent matrix layer without being in contact with the upper surface of the second semiconductor layer.

5. The opto-electronic device of claim 4, wherein entire peripheral surface of each of the plurality of quantum dots is surrounded by the transparent matrix layer.

6. The opto-electronic device of claim 2, wherein the plurality of quantum dots are arranged on an upper surface of the transparent matrix layer to be in contact with the upper surface of the transparent matrix layer.

7. The opto-electronic device of claim 2, wherein a ratio of a first area occupied by the plurality of quantum dots to a second area of the two-dimensional plane in the single layer in which the plurality of quantum dots are arranged is about 0.1 or more.

8. The opto-electronic device of claim 1, wherein the plurality of quantum dots are arranged in a plurality of two-dimensional layers to have a stacked structure.

9. The opto-electronic device of claim 8, wherein a gap is provided between adjacent two-dimensional layers of the plurality of quantum dots, and the gap is filled with the transparent matrix layer.

10. The opto-electronic device of claim 1, wherein the plurality of quantum dots are irregularly dispersed in the transparent matrix layer.

11. The opto-electronic device of claim 1, wherein the transparent matrix layer has a thickness of about 1 nm to about 100 nm.

12. The opto-electronic device of claim 1, wherein the transparent matrix layer comprises a transparent oxide semiconductor material.

13. The opto-electronic device of claim 12, wherein the transparent oxide semiconductor material comprises at least one of silicon indium zinc oxide (SIZO), silicon zinc tin oxide (SZTO), indium gallium zinc oxide (IGZO), indium zinc oxide (IZO), or zinc tin oxide (ZTO).

14. The opto-electronic device of claim 12, wherein the transparent matrix layer has electrical characteristics of the first conductivity type.

15. The opto-electronic device of claim 14, wherein the plurality of quantum dots has electrical characteristics of the second conductivity type.

16. The opto-electronic device of claim 12, wherein the transparent matrix layer has electrical characteristics of the second conductivity type.

17. The opto-electronic device of claim 16, wherein the plurality of quantum dots has electrical characteristics of the first conductivity type.

18. The opto-electronic device of claim 12, wherein the transparent matrix layer comprises:

a first matrix layer provided on the upper surface of the second semiconductor layer; and a second matrix layer provided on an upper surface of the first matrix layer, wherein the first matrix layer and the second matrix layer have electrically opposite conductivity types.

19. The opto-electronic device of claim 18, wherein the plurality of quantum dots are arranged on the upper surface of the first matrix layer, and the second matrix layer covers the plurality of quantum dots.

20. The opto-electronic device of claim 19, wherein the first matrix layer has electrical characteristics of the first conductivity type, the second matrix layer has electrical characteristics of the second conductivity type, and the plurality of quantum dots have electrical characteristics of the second conductivity type.

21. The opto-electronic device of claim 1, wherein the second semiconductor layer is in direct contact with the upper surface of the first semiconductor layer.

22. An image sensor comprising:

an array of opto-electronic devices; and a driving circuit configured to output a signal from each of the opto-electronic devices, wherein each of the opto-electronic devices comprises:

a first semiconductor layer of a first conductivity type;

a second semiconductor layer of a second conductivity type provided on an upper surface of the first semiconductor layer, the second conductivity type being electrically opposite to the first conductivity type;

a transparent matrix layer provided on an upper surface of the second semiconductor layer;

a plurality of quantum dots arranged to be in contact with the transparent matrix layer; and a first electrode provided on a first side of the transparent matrix layer and a second electrode provided on a second side of the transparent matrix layer opposite to the first side, wherein the first electrode and the second electrode are electrically connected to the second semiconductor layer, wherein the first semiconductor layer is doped to have a first doping concentration, and the second semiconductor layer is doped to have a second doping concentration less than the first doping concentration.

23. A junction field effect transistor (JFET) comprising:

a first semiconductor layer;

a second semiconductor layer provided on an upper surface of the first semiconductor layer;

a transparent matrix layer provided on an upper surface of the second semiconductor layer;

a plurality of quantum dots in contact with the transparent matrix layer; and a first electrode provided on a first side of the transparent matrix layer and a second electrode provided on a second side of the transparent matrix layer, wherein the first semiconductor layer is doped to have a first doping concentration, and the second semiconductor layer is doped to have a second doping concentration less than the first doping concentration.

* * * * *